United States Patent
Coy et al.

[11] Patent Number: 5,952,949
[45] Date of Patent: Sep. 14, 1999

[54] TIMER WITH DYNAMIC RESET THRESHOLD

[75] Inventors: Bruce Harrison Coy, San Diego; Kenneth Smetana, Escondido, both of Calif.

[73] Assignee: Applied Micro Circuits Corporation, San Diego, Calif.

[21] Appl. No.: 09/019,526

[22] Filed: Feb. 5, 1998

[51] Int. Cl.$^6$ .............................. H03K 4/06; H03M 1/66
[52] U.S. Cl. ............................................. 341/144; 327/142
[58] Field of Search ................................. 341/118, 120, 341/144, 152, 169; 327/142

[56] References Cited

U.S. PATENT DOCUMENTS

| | | | |
|---|---|---|---|
| 3,411,153 | 11/1968 | Steele | 340/347 |
| 4,409,494 | 10/1983 | Smith | 307/238.3 |
| 4,503,396 | 3/1985 | Fawkes | 328/127 |
| 4,739,192 | 4/1988 | Price, Jr. | 307/362 |
| 4,774,497 | 9/1988 | Taylor | 341/118 |
| 4,779,013 | 10/1988 | Tanaka | 307/443 |
| 4,885,585 | 12/1989 | Barrow et al. | 341/169 |
| 4,950,929 | 8/1990 | Yan | 307/491 |
| 5,231,314 | 7/1993 | Andrews | 307/480 |
| 5,241,221 | 8/1993 | Fletcher et al. | 307/263 |
| 5,329,175 | 7/1994 | Peterson | 307/443 |
| 5,406,215 | 4/1995 | Asahina | 326/27 |
| 5,483,183 | 1/1996 | Li et al. | 327/54 |
| 5,502,410 | 3/1996 | Dunn et al. | 327/140 |
| 5,514,979 | 5/1996 | Collins et al. | 326/27 |
| 5,517,143 | 5/1996 | Gross | 327/108 |
| 5,585,795 | 12/1996 | Yuasa et al. | 341/118 |
| 5,617,051 | 4/1997 | Bingham | 327/317 |
| 5,627,486 | 5/1997 | Gross | 327/108 |
| 5,633,637 | 5/1997 | Noro | 341/144 |

*Primary Examiner*—Howard L. Williams
*Assistant Examiner*—Peguy JeanPierre
*Attorney, Agent, or Firm*—Gray Cary Ware Friedenrich

[57] ABSTRACT

A timing vernier repeatedly generates a timing output signal, which includes a timing event such as a state transition, pulse, etc. Unlike prior timing verniers, the present timing event is capable of significantly faster repetition rates. After the ramp signal is initiated responsive to a trigger signal, it changes from a predetermined starting level at a predetermined substantially linear rate. A digital-to-analog converter (DAC) provides an analog timing select signal and a reset select signal responsive to a digital timing select signal. The reset select signal represents the current timing select signal offset by a predetermined amount. A comparator, coupled to the ramp and the DAC, produces the timing event when the ramp output signal reaches the analog timing select signal. Thus, greater analog timing select signals cause earlier timing events, whereas lesser timing select signals result in later timing events. The delay of the timing event is directly proportional to the analog timing select signal. A threshold sensor, coupled to the ramp and the DAC, provides the ramp's reset signal when the ramp output signal reaches the reset select signal. Since the reset select signal is automatically adjusted to be a fixed offset from the analog timing select signal, the ramp is reset as early as possible, without waiting for the ramp output signal to finish its course.

15 Claims, 6 Drawing Sheets

TIMER WITH DYNAMIC RESET THRESHOLD

BACKGROUND OF THE INVENTION

1. Field of the Invention

The present invention relates to electronic timers for generating precise timing signals. More particularly, the invention concerns a timer capable of faster retriggering due to a dynamic reset threshold.

2. Description of the Related Art

Electronic timers are widely used in many different applications. For example, electronic clocks generate carefully defined, high speed clock cycles necessary to operate digital computers. Timers are also an integral component of test circuits that measure and evaluate operational characteristics of circuits such as memory, microprocessors, high speed logic circuits, and the like. This type of test circuit is often implemented in an automatic test equipment board, which frequently includes both digital and analog circuits.

In this context, engineers have developed a class or circuits called "timing verniers", which provide finely adjustable timing signals. Timing verniers are often sold as a "macro" item, selected by a customer for use in an application specific integrated circuit along with other desired components.

There are many known timing verniers, one class of which is exemplified by the model PDS01S product manufactured by Applied Micro Circuits Corp. (AMCC). This class of timing vernier includes a number of components, shown in simplified block form in FIG. 1. Namely, the timing vernier 100 includes a ramp 102, digital-to-analog converter (DAC) 104, comparator 106, and threshold sensor 114. The ramp 102 produces an analog voltage signal (at output 103) that decreases at a prescribed linear rate. The signal at the output 103 may also be called a "ramp" signal. The DAC 104 provides a fixed analog timing signal select (at output 110) according to a digital timing select input signal (at input 108). When the comparator 106 determines that the ramp's decreasing output signal (at 103) reaches the fixed analog timing select signal 110, the comparator 106 produces a timing event. The timing event is a characteristic of the timing output signal, and may comprise a pulse, digital signal transition (i.e., high-to-low or low-to-high), or another recognizable signal characteristic. When the threshold sensor 114 determines that the ramp's decreasing output signal (at 103) matches the fixe reset select signal on the line 115, the sensor 114 issues a reset signal to the ramp 102, causing the ramp 102 to bring its output back to a predetermined starting level.

Figure 2:
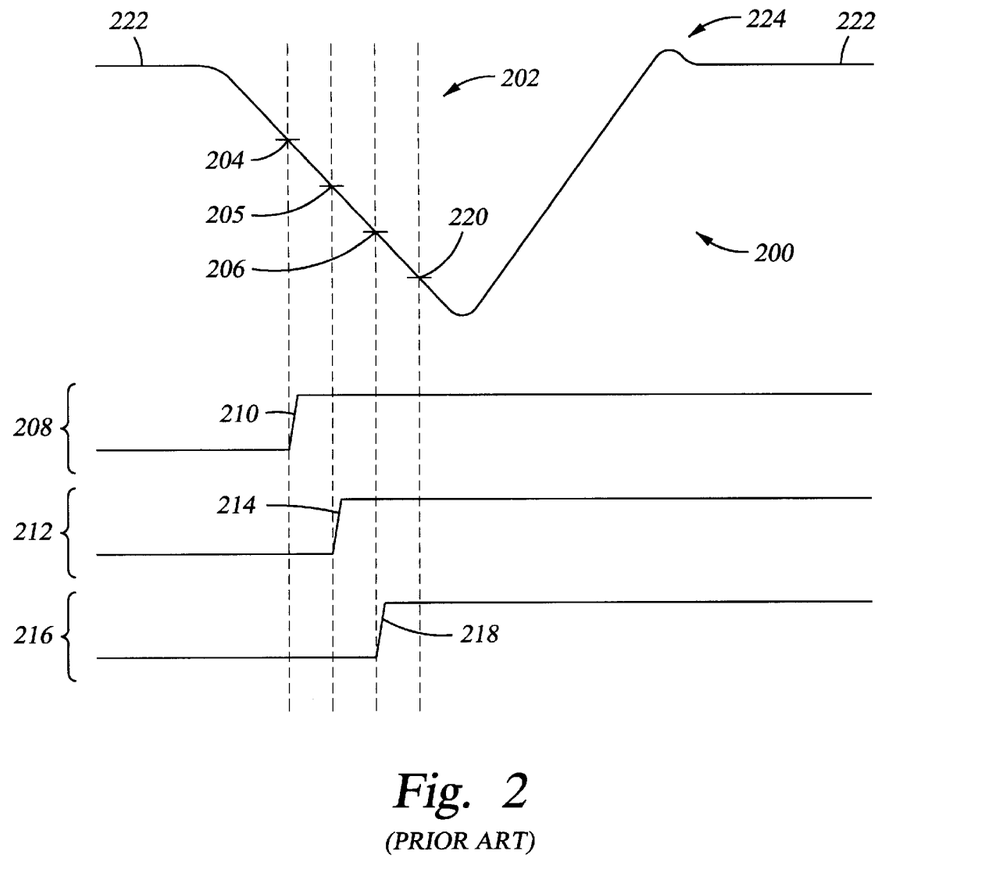
FIG. 2 is a timing diagram illustrating the operation of a known timing vernier.

FIG. 2 depicts a timing diagram illustrating the operation of the timing vernier 100. The output 103 of the ramp 102 is shown by the waveform 200. Starting from a predetermined starting value 222, the waveform 200 then provides an analog voltage decreasing at a constant level throughout a region 202 of the waveform 200. Several alternative analog timing select signals 110 are shown by the levels 204–206. Each different analog timing select signal is produced by changing the voltage of the digital timing select input signal 108. Different analog timing select signals produce timing events that occur at different times.

For example, if the digital timing select signal 108 is chosen to provide an analog timing select signal 204, the comparator 106 detects when the ramp signal 200 reaches the level 204 when this occurs, the output 112 of the comparator 106 exhibits a timing signal 208 including the timing transition 210. As a different example, the digital timing select signal 108 may be set to yield an analog timing select signal at the level 205. In this case, when the comparator 106 detects the ramp signal 202 reaching the level 205, the output 112 of the comparator 106 exhibits a timing signal 212 including the timing transition 214. Alternatively, the digital timing select signal 108 may instead be set to yield an analog timing select signal at the level 206. In this case, when the comparator 106 detects the ramp signal 202 reaching the level 206, the output 112 of the comparator 106 exhibits the timing signal 216 with the timing transition 218.

Figure 1:
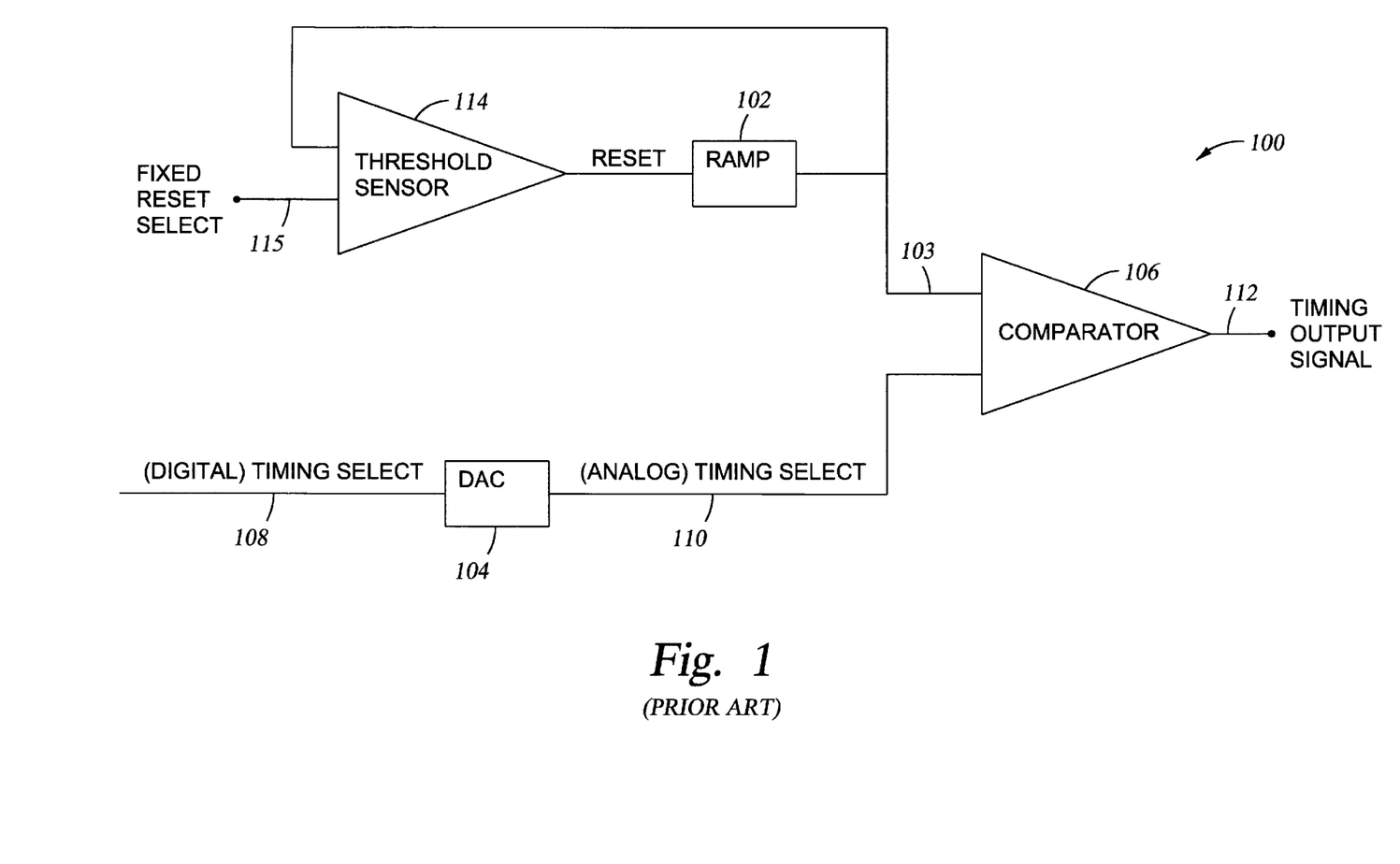
FIG. 1 is a block diagram of the hardware components and interconnections of a known timing vernier.

As shown in FIG. 1, the threshold sensor 114 is provided to recognize when the output signal 103 of the ramp 102 reaches a fixed threshold value 220, set by the input 115. When the output signal 103 reaches the value 220, the threshold sensor 114 resets the ramp 102, causing the ramp 102 to increase its output back to the predetermined starting value 222 (FIG. 2). There may be some delay in reaching the steady-state value 222 due to overshooting and/or ringing that occurs in a region 224 of the waveform 200.

Although known timing verniers such as the foregoing constitute significant advances and enjoy widespread commercial success today, AMCC has continually sought to improve the performance and efficiency of their timing verniers. One area of particular focus is the speed and signal resolution of timing signals. All timing verniers produce timing signals whose frequency is subject to some maximum value, beyond which the resultant timing signal may unreliable. If the timing signal is not sufficiently fast or crisp in definition, the circuit using the timing signal may produce inaccurate data.

Nonetheless, with the ever-increasing operating speeds of circuits to be tested, it is increasingly important to have timers that provide faster and more clearly defined timing signals. Consequently, advances are continually needed to boost the speed and resolution of timing signals.

SUMMARY OF THE INVENTION

Broadly, the present invention concerns a circuit that repeatedly generates a timing signal. The timing signal includes a timing event, such as a state transition, pulse, or any other distinguishable signal characteristic. Unlike prior timing verniers, the present timing signal is capable of significantly faster repetition rates. Thus, this invention's timing vernier is especially useful for testing high speed components such as RAM, microprocessors, high speed logic, and the like.

The ramp output signal is initiated responsive to a reset signal. After this, it changes from a predetermined starting level at a predetermined substantially linear rate. This change may be an increase or decrease, depending upon the particular application. A digital-to-analog converter (DAC) provides an analog timing select signal and a reset select signal responsive to an input signal comprising a digital timing select signal. The analog timing select signal is an analog representation of the digital timing select signal. Thus, no matter what analog timing select signal is produced by the DAC, the DAC also a similar reset select signal, offset from the analog timing signal by a predetermined amount. The offset may involve a fixed voltage increase or decrease, depending upon the requirements of the particular application.

A comparator, coupled to the ramp and the DAC, produces the timing event when the ramp output signal matches the analog timing select signal. In an embodiment where the ramp signal decreases, greater analog timing select signals cause the timing event to occur earlier, whereas lesser analog timing select signals cause the timing event to occur later. The delay of the timing output signal is directly proportional to the analog timing select signal. A threshold sensor, coupled to the ramp and the DAC, provides the ramp's reset signal when the ramp output signal reaches the reset select signal.

The invention affords its users with a number of distinct advantages. Chiefly, the invention enables extremely high speed clocking of fast circuit components. When the ramp output signal reaches the timing select signal, the timing output signal is generated. Soon after, as determined by the fixed voltage difference between the analog timing select signal and reset select signal, the ramp output reaches the reset select signal and resets the ramp. Regardless of the analog timing select signal's value, the reset select signal is always a fixed amount less. Thus, whether the analog timing select signal is relatively high or low, the ramp is always reset quickly after generation of the timing event, permitting extremely fast repetition rates. The invention also provides a number of other advantages and benefits, which should be apparent from the following description of the invention.

DETAILED DESCRIPTION

The nature, objects, and advantages of the invention will become more apparent to those skilled in the art after considering the following detailed description in connection with the accompanying drawings. As mentioned above, the invention concerns a circuit that repeatedly generates a timing output signal, including a timing event such as a state transition, pulse, etc. Unlike prior timing verniers, the present timing signal is capable of significantly faster repetition rates.

HARDWARE COMPONENTS & INTERCONNECTIONS

Figure 3:
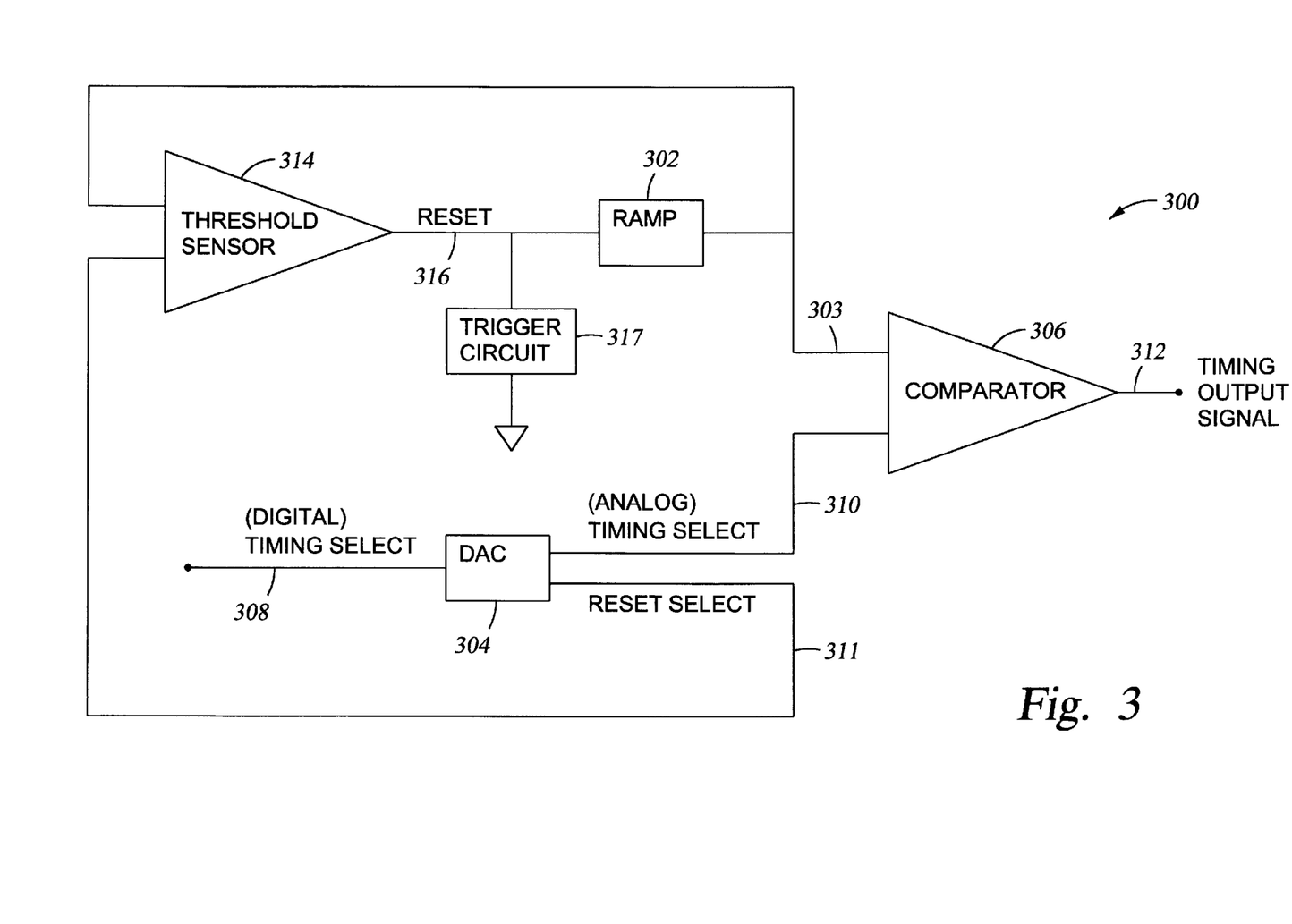
FIG. 3 is a block diagram of the hardware components and interconnections of a timing vernier according to the invention.

The timing circuit of this invention may be embodied by various hardware components and interconnections, an example of which is shown by the timing vernier 300 of FIG. 3. The timing vernier 300 includes a ramp 302, a digital-to-analog converter (DAC) 304, a comparator 306, and a threshold sensor 314.

Ramp

The ramp 302 produces an analog ramp output signal at an output 303. As one example, the ramp output signal may be an electrical voltage, current, or another electrical property. The ramp output signal starts at a predetermined level, and changes substantially linearly at a prescribed linear rate. One example is one volt/nanosecond. The ramp signal may change by decreasing or increasing, depending upon the particular application. The ramp may be implemented by discrete circuit components, a new or commercially available integrated circuit, or a macro supplied for incorporation into an application specific integrated circuit (ASIC).

The commencement of the changing ramp output signal occurs in response to the ramp 302 receiving a "trigger" signal on the line 316. In the illustrated embodiment, the "trigger" signal constitutes a binary zero, whereas a "reset" signal is provided by a binary one. In contrast to the trigger signal, which initiates the changing ramp signal, the reset signal stops the ramp signal from changing and causes the ramp to reset to a predetermined starting value.

DAC

The DAC 304 provides two output signals, at corresponding outputs 310–311. On the output 310 the DAC 304 provides an analog timing select signal, comprising a D.C. analog output signal representative of a digital timing select input signal received on an input 308. In other words, the DAC 304 converts the digital signal received on the input 308 into an analog signal on the output 310.

At the output 311, the DAC 304 produces a reset select signal. This is a D.C. analog signal that differs by a fixed amount from the timing select signal on the output 310. In one example, where the ramp output signal decreases, the reset select signal 311 may be slightly less than the signal 310 to provide quick resetting of the ramp after generating the timing event. Alternatively, even with a decreasing ramp output signal, the signal 311 may be greater than the signal 310 to account for any reset delay inherent to the circuits 314/302. To provide a specific example, where the signals comprise voltages, the reset select signal (output 311) may be equal to the timing select signal (output 310) reduced by a predetermined voltage, such as about 20–50 millivolts.

The DAC 304 may be implemented by discrete circuit components, a new or commercially available integrated circuit, or a macro supplied for incorporation into an ASIC. A more detailed illustration of one DAC embodiment is shown below.

Comparator

The comparator 306 produces its timing event on the output 312 when the ramp's changing output signal (output 303) reaches the timing select signal 310. At this time, the comparator 306 generates the timing event on the output 312. The timing event, may comprise any sufficiently distinct electrical characteristic such as pulse, digital signal transition (i.e., high-to-low or low-to-high), zero voltage crossing, or any another distinguishable signal characteristic.

The comparator 306 may be implemented by discrete circuit components, a new or commercially available integrated circuit, or a macro supplied for incorporation into an ASIC.

Threshold Sensor

The threshold sensor 314 receives the reset select signal 311 and the ramp output signal 303. The threshold sensor 314 compares these signals to recognize when the ramp output signal 303 matches the reset select signal 311. When this occurs, the threshold sensor 314 resets the ramp 302, causing the ramp 302 to increase the ramp output 303 back to its predetermined starting value. As mentioned above, the reset signal generated by the threshold sensor 314 comprises a binary zero in the illustrated embodiment. Unlike prior arrangements, the ramp 302 is reset very soon after the ramp output signal reaches the analog timing select value, without waiting for the ramp signal output to reach some fixed minimum value.

The threshold sensor 314 may be implemented by discrete circuit components, a new or commercially available integrated circuit, or a macro supplied for incorporation into an ASIC. As one example, the threshold sensor 314 may comprise a comparator similar to the comparator 306.

Trigger Circuit

The timing vernier 300 also includes a trigger circuit 317, which serves to selectively bring the signal on the line 316 to a low voltage, i.e., binary zero. The low voltage at the line 316 constitutes a "trigger" signal, which serves to initiate the ramp cycle of the ramp signal generator, from its initial, steady state starting value.

As an example, the trigger circuit 317 may comprise a transistor or another suitable circuit to selectively reduce the voltage on the line 316 to near zero. The trigger circuit 517 may be activated on any appropriate basis, such as on a periodic basis (e.g., 800 MHz), or at user selected times. In contrast, as discussed above, the reset signal occurs automatically when the ramp output signal matches the analog timing select signal (to reset the ramp signal back to its starting value).

DAC: More Detail

As mentioned above, the DAC 304 receives a digital timing select signal, and provides (1) an analog timing select signal 310 corresponding to the digital timing select signal 308, and (2) a reset select signal, comprising the analog timing select signal offset by a fixed amount.

Figure 4A:
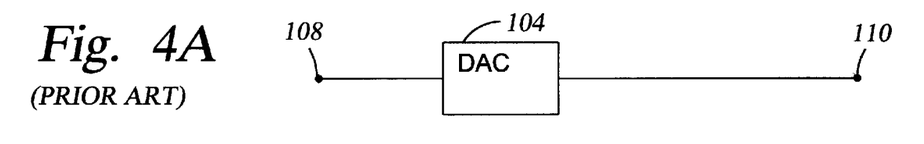
FIG. 4A is a block diagram of the hardware components and interconnections of a known digital-to-analog converter.
Figure 4B:
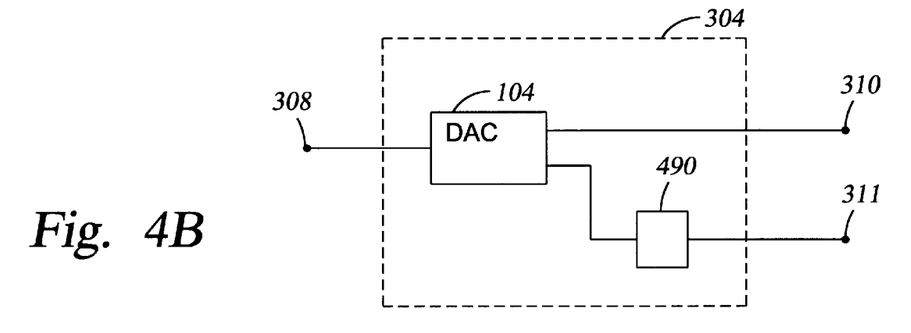
FIG. 4B is a block diagram of the hardware components and interconnections of one embodiment of digital-to-analog converter according to the invention.

According to the invention, the foregoing functions may be implemented using many different embodiments of circuitry. To illustrate one example, the inventive DAC 304 may be implemented by modifying the DAC 104. FIG. 4A depicts the DAC 104, unmodified. FIG. 4B shows the DAC 104 coupled to a reset select module 490, this combination providing the new DAC 304 according to the invention. The reset select module 490 provides the reset select signal at the output 311, comprising the timing select signal 310 offset by a fixed amount, e.g. 20–50 millivolts. Thus, regardless of the timing select signal's magnitude, the reset select signal always provides a signal that is by a fixed amount. This offset may be an increase or decrease offset in magnitude, depending upon the application.

Figure 4C:
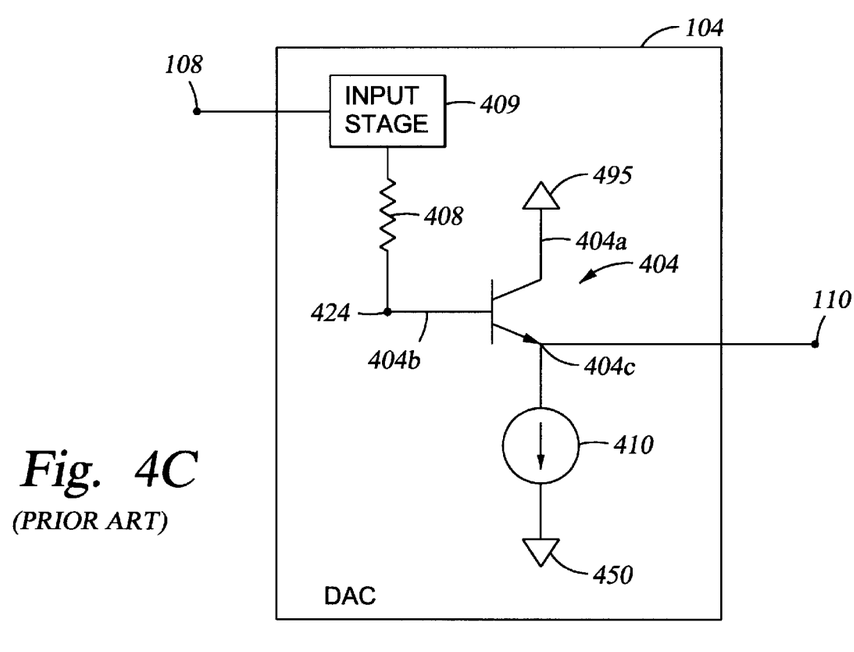
FIG. 4C is a more detailed diagram showing the circuitry of a known digital-to-analog converter.
Figure 4D:
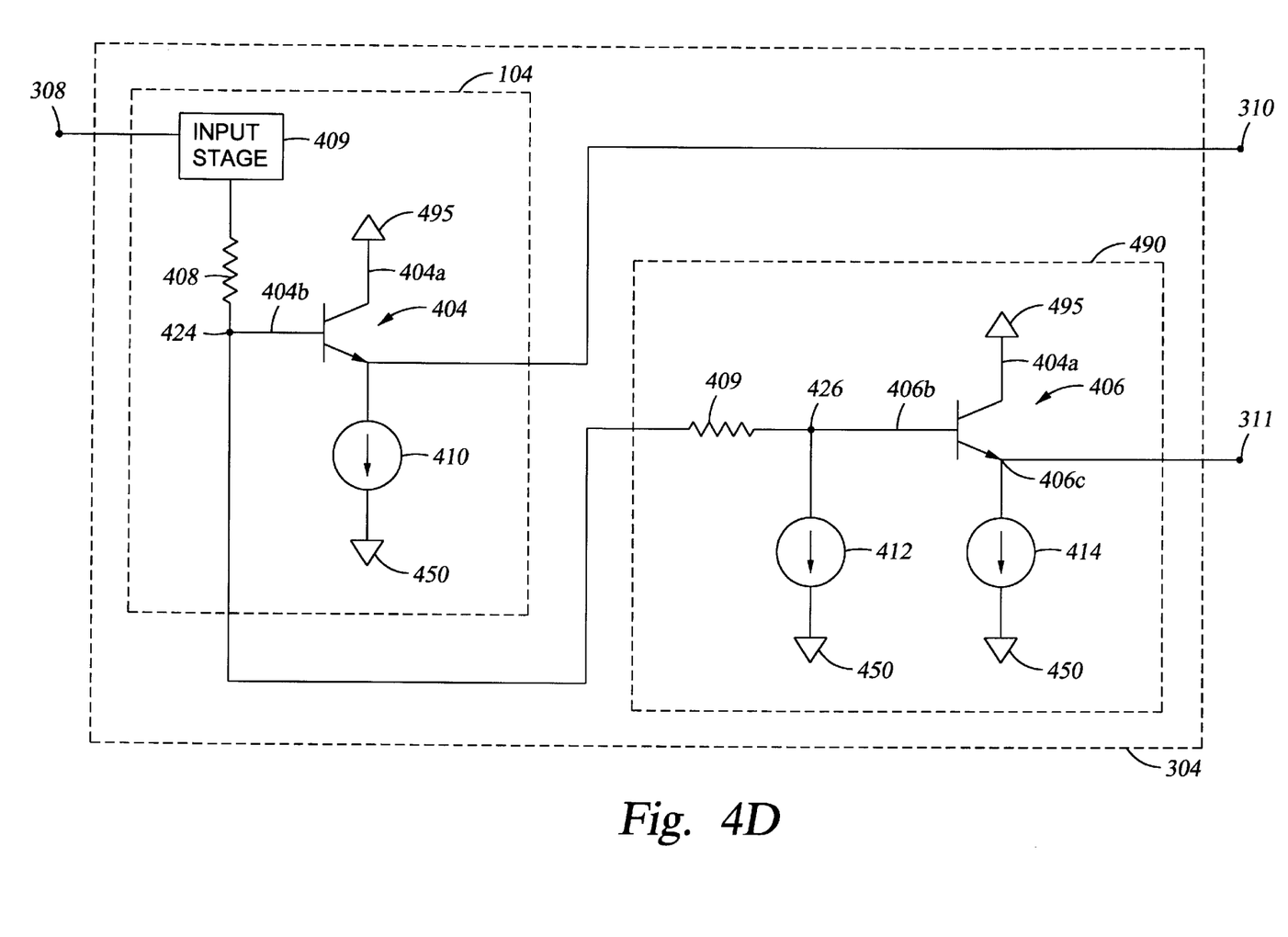
FIG. 4D is a more detailed diagram showing the circuitry of a digital-to-analog converter according to the invention.

One implementation of the reset select module 490 is now discussed with reference to FIGS. 4C–4D. FIG. 4C depicts circuitry of the known DAC 104, which includes an input stage 409 and various output circuitry. The input stage 409, which receives the digital timing select signal 308, contains known circuitry and is coupled to a bipolar junction transistor 404 via a resistor 408. The transistor 404 includes a collector 404a coupled to a power supply 495, a base 404b coupled to the resistor 408 at a node 424, and an emitter 404c coupled to a current source 410. The current source 410 is also coupled to electrical ground 450. At the output 110, the emitter 404c provides the output of the DAC 104, i.e.,
the analog timing select signal. The circuitry of the DAC 104 is exemplified by the AMCC model PDSOIS product, which is commercially available To modify FIG. 4C's embodiment of DAC 104 to provide the invention's reset select signal, the reset select module 490 is added as shown in FIG. 4D. Namely, a second bipolar junction transistor 406 is coupled to the node 424 via a second resistor 409. The second transistor 406 includes a collector 406a coupled to the power supply 495, a base 406b coupled to the resistor 409 at node 426, and an emitter 406c coupled to a current source 414. Another current source 412 is coupled to the node 426. Both current sources 412/414 are coupled to electrical ground 450. At the output 311, the emitter 406c provides the reset select signal of the DAC 304.

In the illustrated embodiment, the voltage drop provided by the first resistor 408 determines the analog timing select signal on the output 310. Similarly, the voltage drop provided by the second resistor 409 determines the reset select signal on the output 311.

Without departing from the invention, the components of FIG. 4D may be changed in various ways. For example, the bipolar junction transistors 404/406 may be replaced with field effect transistors, diode arrangements, or any switches of similar operating characteristics providing output signals on their respective outputs 310–311 proportional to their corresponding inputs 404b/406b. In the specific example of FIG. 4, bipolar junction transistors are shown, configured as emitter followers.

Furthermore, the resistors 408–409 may be replaced with diodes, zener diodes, transistor junctions, or any other device providing a drop in voltage. Although the current sources are shown providing electrical current flowing toward ground, ordinarily skilled artisans will recognize that the DAC 400 may be alternatively designed so that the current sources provide current in the opposite direction. Likewise, the circuitry may be altered so that the power supply 495 may provide positive or negative voltage. Furthermore, the components of the DAC 304 may be implemented by discrete circuit components, a new or commercially available integrated circuit, or a macro supplied for incorporation into an ASIC.

As an alternative to the specific circuitry of FIG. 4D, the reset select module 490 may be implemented using the output of a voltage source coupled to an appropriate point, such as the node 424 or the output 310. As another alternative, the module 490 may comprise a diode or another suitable component providing a fixed voltage drop with respect to the voltage present at the output 310.

OPERATION

In addition to the various hardware embodiments described above, a different aspect of the invention concerns the operation of the timing vernier of the invention. This procedure is illustrated with the aid of the timing diagram of FIG. 5.

Figure 5:
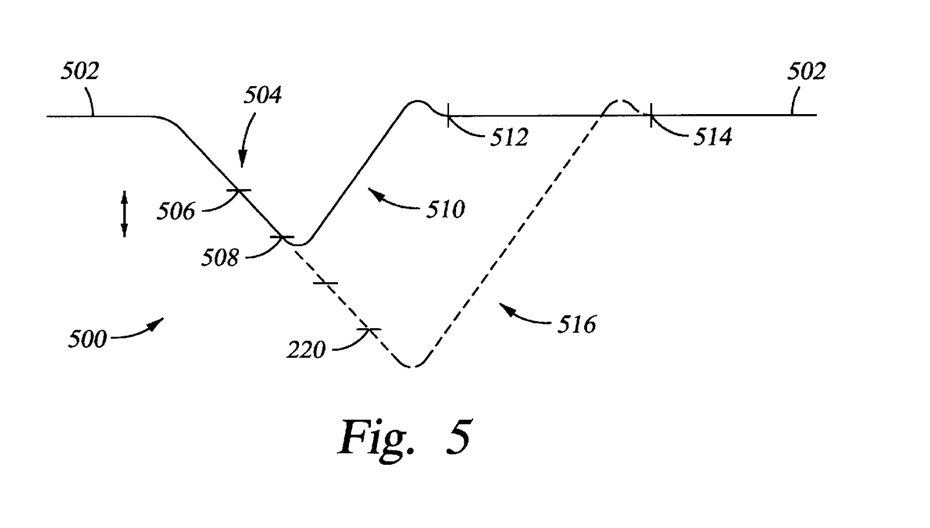
FIG. 5 is a timing diagram illustrating the operation of the timing vernier of the invention.

The output 303 of the ramp 302 is shown by the waveform 500. The ramp output signal 303 starts from a predetermined starting value 502. As illustrated, this value is an analog voltage. When the ramp 302 receives a trigger signal on the input 316, the waveform 500 then decreases at a constant level, as illustrated by the region 504. The trigger signal is supplied by the trigger circuit 317, as discussed above.

The voltage level 506 depicts a particular setting of the analog timing select signal. The voltage level 508 appears a predetermined voltage lower, showing the reset select signal. The voltage levels 506–508 are provided by the outputs 310–311, respectively.

The comparator 306 senses when the ramp output signal 303 reaches the voltage 506. In response, the comparator 306 provides its timing event at its output 312. Nonetheless, the ramp output signal continues to decrease until it reaches the voltage 508 (defined by the reset select signal); this condition is sensed by the threshold sensor 314. In response, the threshold sensor 314 provides a reset signal to the input 316, resetting the ramp 302 and ending its descent. When the ramp is reset, it begins a climb 510 to reset is output voltage to the starting level 502.

With the early cutoff provided by the reset select voltage 508, the ramp output arrives back at the level 502 substantially faster. In the illustrated example, a time 512 shows when the ramp output signal achieves steady state at the level 502. If the ramp output signal were permitted to fully decrease to the prior art's fixed threshold value 220, the ramp's output signal appears as shown by 516. In this case, the ramp output signal 516 does not reach steady state at the level 502 until a time 514, significantly later than the time 512.

OTHER EMBODIMENTS

While the foregoing disclosure shows a number of illustrative embodiments of the invention, it will be apparent to those skilled in the art that various changes and modifications can be made herein without departing from the scope of the invention as defined by the appended claims. Furthermore, although elements of the invention may be described or claimed in the singular, the plural is contemplated unless limitation to the singular is explicitly stated.

Figure 6:
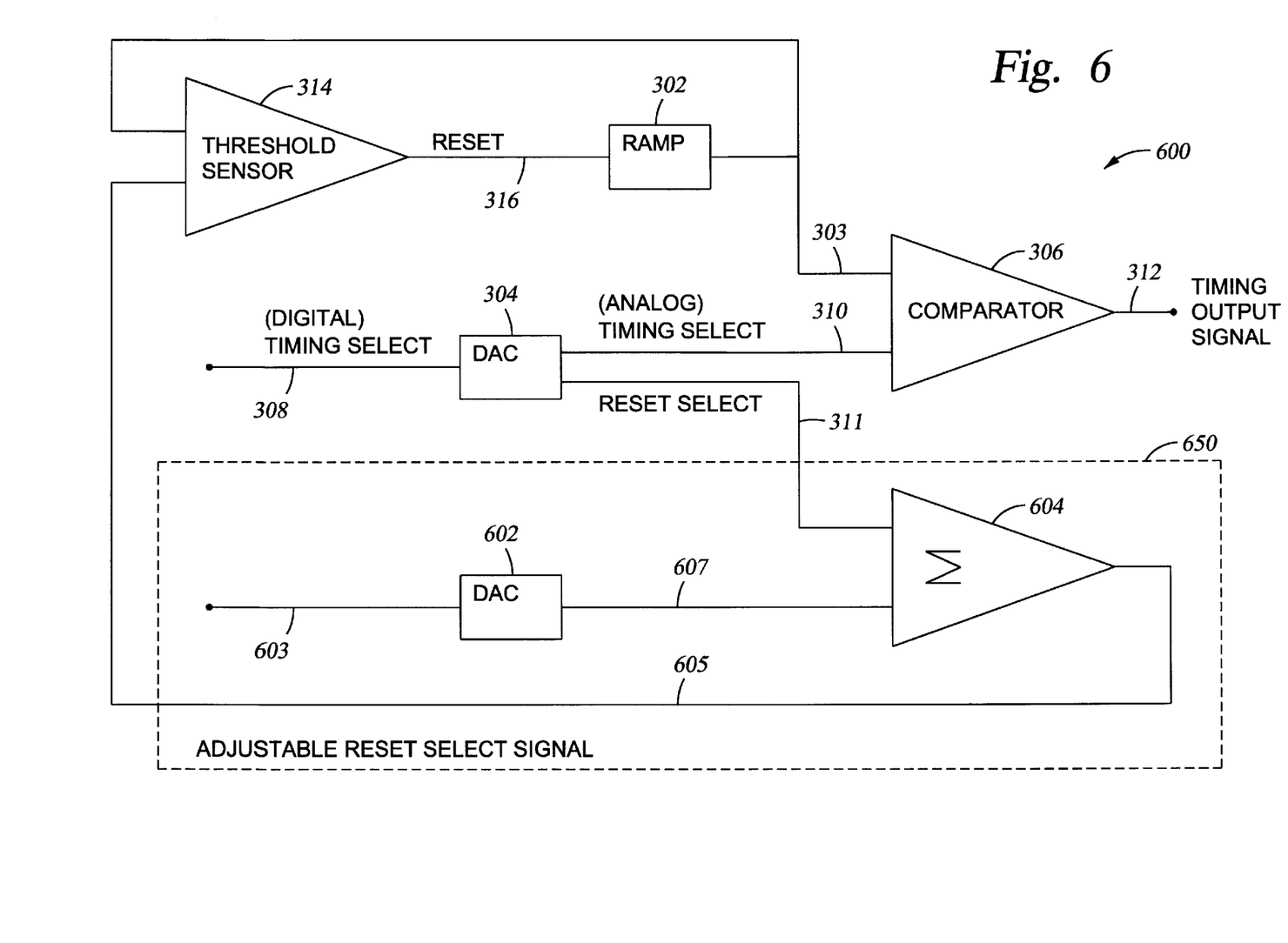
FIG. 6 is a block diagram of the hardware components and interconnections of an alternative embodiment of timing vernier according to the invention.

FIG. 6 depicts a timing vernier 600 to provide one example of an alternate embodiment. The timing vernier 600 is a modification to the components of the timing vernier 300 (FIG. 300). Particularly, the vernier 600 includes all components of the vernier 300, along with an adjustment unit 650 for selectively increasing or decreasing the difference between the reset select signal 311 and the timing select signal 310. As discussed above, the reset select signal 311 and reset select signal 311 differ by a fixed amount. The timing vernier 600 adds the adjustment unit 650, including a second DAC 602 and a summer 604, to selectively create an adjusted reset select signal 605. An input 603 to the DAC 602 determines an analog voltage on a line 607, which is added to the reset select signal 311 by the summer 604. The voltage 607 can be positive or negative to decrease or increase the difference between the signals 605 and 310.

What is claimed is:

1. A timing signal generator, comprising:
   a voltage ramp initiating a ramp output signal changing from a predetermined starting level at a predetermined substantially linear rate, the voltage ramp resetting the ramp output signal to the starting level in response to a reset signal;
   a first digital-to-analog converter (DAC) providing first and second output signals responsive to a digital input signal, the first output signal comprising an analog representation of the digital input signal, the second output signal comprising the first output signal offset by a predetermined amount;
   a comparator coupled to the ramp and the first DAC, producing a predetermined timing event when the ramp output signal reaches the first output signal; and
   a threshold sensor coupled to the ramp and the first DAC, providing the reset signal to the ramp when the ramp output signal reaches the second output signal.

2. The generator of claim 1, the timing event comprising a transition change of a binary signal.

3. The generator of claim 1, the DAC comprising:
   a DAC sub-unit responsive to the digital input signal to provide the first output signal comprising an analog representation of the digital input signal; and
   a reset select module coupled to DAC sub-unit to generate the second output signal comprising the first output signal offset by a predetermined amount.

4. The generator of claim 3, the reset select module comprising a diode.

5. The generator of claim 3, the reset timing module comprising:
   a voltage source exhibiting a predetermined voltage drop, coupled to the first output signal.

6. The generator of claim 3,
   the DAC sub-unit comprising:
      a first switch having an input node, power supply node, and output node, the output node providing the first output signal;
      a first voltage dissipating device coupled to the first switch's input node;
      a first current source coupled between the first switch's output node and electrical ground; and
   the reset timing module comprising:
      a second switch having an input node, power supply node, and output node, the output node providing the second output signal;
      a second voltage dissipating device coupled between the first and second switches' input nodes;
      a second current source coupled between the second switch's output node and electrical ground; and
      a third current source coupled between the second switch's input node and electrical ground.

7. The generator of claim 3, at least one of the switches comprising a bipolar junction transistor where the input node, power supply node, and output node are provided by a respective base, collector, and emitter of the bipolar junction transistor.

8. The generator of claim 3, at least one of the switches comprising a field effect transistor where the input node, power supply node, and output node are provided by a respective gate, source, and drain of the field effect transistor.

9. The generator of claim 3, at least one of the voltage dissipating elements comprising a resistor.

10. The generator of claim 3, the switches' power supply nodes being coupled to first and second predetermined positive voltages, the current sources flowing current in a direction toward the electrical ground.

11. The generator of claim 1, further comprising:
    an adjustment unit interposed between the first DAC and the threshold sensor to adjust the second output signal by a user selected amount.

12. The generator of claim 1, the adjustment unit comprising.
    a second DAC providing an adjustment signal responsive to a digital input signal; and
    a summer interposed between the DAC and the threshold sensor to form an adjusted second output signal by adding the adjustment signal with the second output signal, the summer providing the adjusted second output signal to the threshold sensor.

13. The generator of claim 1, the voltage ramp initiating the ramp output signal to decrease from the predetermined starting level.

14. The generator of claim 1, the first DAC providing the second output signal equal to the first output signal reduced by a predetermined amount.

15. A timing signal generator, comprising:

a first means for initiating a ramp output signal changing from a predetermined starting level at a predetermined substantially linear rate, the first means resetting the ramp output signal to the starting level in response to a reset signal;

a second means for providing first and second output signals responsive to a digital input signal, the first output signal comprising an analog representation of the digital input signal, the second output signal comprising the first output signal offset by a predetermined amount;

a third means coupled to the first means and the second means, for producing a predetermined timing event when the ramp output signal reaches the first output signal; and a fourth means, coupled to the first means and the second means, for providing the reset signal to the first means when the ramp output signal reaches the second output signal.

* * * * *